US012672541B2

(12) United States Patent
Kim et al.

(10) Patent No.: US 12,672,541 B2
(45) Date of Patent: Jun. 30, 2026

(54) SUBSTRATE COMPRISING A LID STRUCTURE, PACKAGE SUBSTRATE COMPRISING THE SAME AND SEMICONDUCTOR DEVICE

(71) Applicant: ABSOLICS INC., Covington, GA (US)

(72) Inventors: Sungjin Kim, Suwanee, GA (US); Jincheol Kim, Suwon-si (KR)

(73) Assignee: ABSOLICS INC.

( * ) Notice: Subject to any disclaimer, the term of this patent is extended or adjusted under 35 U.S.C. 154(b) by 586 days.

(21) Appl. No.: 17/870,177

(22) Filed: Jul. 21, 2022

(65) Prior Publication Data

US 2023/0028070 A1     Jan. 26, 2023

Related U.S. Application Data

(60) Provisional application No. 63/225,038, filed on Jul. 23, 2021.

(51) Int. Cl.
*H10W 40/22*          (2026.01)
*H10W 40/60*          (2026.01)
(Continued)

(52) U.S. Cl.
CPC ........... *H10W 40/22* (2026.01); *H10W 76/60* (2026.01); *H10W 40/641* (2026.01); *H10W 76/12* (2026.01)

(58) Field of Classification Search
CPC ... H01L 23/10; H01L 23/055; H01L 23/4093; H01L 23/3675; H01L 23/04; H01L 23/367; H01L 23/06; H01L 23/08; H01L 24/90; H01L 2924/1616; H01L 2924/16251; H01L 2924/1626; H01L 2924/1627; H01L 2924/1615; H01L 23/02; H01L 23/12–15; H01L 23/32; H01L 23/043–051; H01L 23/053–057; H01L 2924/171; H01L 2924/1711; H01L 2924/1715; H01L 2924/17151; H01L 2924/161;

(Continued)

(56) References Cited

U.S. PATENT DOCUMENTS 7,342,298 B1 *  3/2008  Zhang ................. H01L 23/3675
                                              257/667
9,332,164 B2 *  5/2016  Webster ................... G02B 7/02
(Continued)

FOREIGN PATENT DOCUMENTS

JP          H07-86471 A          3/1995
JP          H09-219473 A          8/1997
(Continued)

OTHER PUBLICATIONS

Matweb reference for CTE (Year: 1999).*

(Continued)

*Primary Examiner* — Zandra V Smith
*Assistant Examiner* — Douglas Yap
(74) *Attorney, Agent, or Firm* — NSIP Law

(57)          ABSTRACT

Example embodiments provide a package substrate including a lid structure. The package substrate includes a substrate, a semiconductor element arranged on one surface of the substrate, and a lid surrounding at least a portion of the semiconductor element. The lid includes a region extending outwardly beyond the outer periphery of the substrate.

18 Claims, 7 Drawing Sheets

(51) Int. Cl.
  *H10W 76/12*       (2026.01)
  *H10W 76/60*       (2026.01)

(58) Field of Classification Search
  CPC ... H01L 2924/1611; H01L 2924/16151; H01L
  2924/16152–16153; H10W 40/22–228;
  H10W 40/641; H10W 40/20; H10W
  40/231; H10W 40/235; H10W 40/237;
  H10W 40/242; H10W 40/80; H10W
  76/12; H10W 76/15167; H10W 76/63;
  H10W 42/121
  See application file for complete search history.

(56)                    References Cited

U.S. PATENT DOCUMENTS

| | | | |
|---|---|---|---|
| 9,478,504 B1 * | 10/2016 | Shen | H01L 23/49838 |
| 2009/0288852 A1 * | 11/2009 | Hirokawa | H01L 24/97 |
| | | | 156/325 |
| 2009/0302436 A1 * | 12/2009 | Kim | H01L 23/29 |
| | | | 257/659 |
| 2013/0286592 A1 | 10/2013 | Tsuduki et al. | |
| 2014/0237805 A1 | 8/2014 | Suzuki et al. | |
| 2014/0240588 A1 * | 8/2014 | Sakuragi | H10F 39/804 |
| | | | 348/373 |
| 2015/0130040 A1 * | 5/2015 | Defretin | H01L 25/0652 |
| | | | 438/15 |
| 2015/0137345 A1 | 5/2015 | Choi et al. | |
| 2017/0018510 A1 | 1/2017 | Shen et al. | |
| 2017/0372979 A1 * | 12/2017 | Gandhi | H01L 23/3675 |
| 2018/0012865 A1 * | 1/2018 | Schrock | H01L 23/4334 |
| 2018/0047675 A1 | 2/2018 | Xue et al. | |
| 2018/0070162 A1 * | 3/2018 | Lim | H01L 23/043 |
| 2019/0074252 A1 | 3/2019 | Chigullapalli et al. | |
| 2019/0304858 A1 * | 10/2019 | Scharf | H01L 23/4093 |
| 2020/0058567 A1 * | 2/2020 | Kim | H01L 21/56 |
| 2020/0350260 A1 | 11/2020 | Patil et al. | |
| 2021/0035886 A1 | 2/2021 | Islam et al. | |
| 2021/0066154 A1 | 3/2021 | Kim et al. | |
| 2021/0125907 A1 * | 4/2021 | Huang | H01L 21/4853 |
| 2021/0193538 A1 * | 6/2021 | Huang | H01L 23/3675 |
| 2021/0202329 A1 | 7/2021 | Chen et al. | |
| 2021/0305227 A1 * | 9/2021 | Chen | H01L 23/04 |

FOREIGN PATENT DOCUMENTS

| | | | |
|---|---|---|---|
| JP | 2001-196487 A | 7/2001 | |
| JP | 2003-68969 A | 3/2003 | |
| JP | 2015-23267 A | 2/2015 | |
| JP | 2020-25135 A | 2/2020 | |
| KR | 10-2006-0004996 A | 1/2006 | |
| KR | 10-1242655 B1 | 3/2013 | |
| KR | 10-1321101 B1 | 10/2013 | |
| KR | 10-1799645 B1 | 11/2017 | |
| KR | 10-2021-0030408 A | 3/2021 | |
| TW | 201436158 A | 9/2014 | |
| TW | 201606885 A | 2/2016 | |
| TW | 201613049 A | 4/2016 | |
| TW | 201814875 A | 4/2018 | |
| TW | 201906120 A | 2/2019 | |
| WO | WO 2019/221406 A1 | 11/2019 | |
| WO | WO 2020/170535 A1 | 8/2020 | |
| WO | WO 2020/250795 A1 | 12/2020 | |

OTHER PUBLICATIONS

Lau, John et al., "Effect of heat-spreader sizes on the thermal performance of large grid array packages—NuCSP," Microelectronics International, vol. 16, No. 2, 1999, (11 pages in English).

Lau, John, et al., "Effect of heat-spreader sizes on the thermal performance of large cavity-down plastic ball grid array packages—NuCSP." Microelectronics international (1999).

International search report issued on Oct. 27, 2022, in counterpart International Patent Application No. PCT/US22/37995 (3 pages in English).

Written Opinion of the International Searching Authority issued on Oct. 27, 2022, in counterpart International Patent Application No. PCT/US22/37995 (5 pages in English).

* cited by examiner

110

110

100

100

100

100

100

100

100

100

110

15

10

15

30

SUBSTRATE COMPRISING A LID STRUCTURE, PACKAGE SUBSTRATE COMPRISING THE SAME AND SEMICONDUCTOR DEVICE

CROSS-REFERENCE TO RELATED APPLICATIONS

This application claims the benefit of priority under 35 U.S.C. § 119(e) to U.S. Provisional Patent Application No. 63/225,038, filed Jul. 23, 2021. The disclosure of the priority application is incorporated herein by reference in their entirety and for all purposes.

BACKGROUND

1. Field

Example embodiments relate to a substrate including a lid structure, a package substrate including the same, and a semiconductor device including the same.

2. Description of Related Art

A package substrate is constructed such that a semiconductor device is protected from external environmental factors and is well electrically connected to other components such as a printed circuit board. Such a package substrate is generally provided with a heat dissipating member (a lid, heat spreader or heat sink) through which heat generated during operation is dissipated to the outside.

A package substrate employs a heat spreader through which heat generated from the top, bottom, and side surfaces of a semiconductor device is dissipated to the outside. A conventional structure of the heat spreader may provide a cause of deteriorating the lifetime and reliability of the semiconductor device due to its limited heat dissipation characteristics.

The problems caused by the deterioration of heat dissipation characteristics are more profound as semiconductor devices become highly functional and integrated. In view of these problems, there is a need for a novel approach to efficiently dissipate all heat generated from semiconductor devices to the outside.

Furthermore, the use of a glass substrate as a base substrate at a high-end package substrate is advantageous in that interconnection wires between a semiconductor device and a printed circuit board are shortened and excellent electrical properties can be achieved, but it may increase the risk of damage during subsequent processing as well as cause the above-described problems attributed to poor heat dissipation characteristics. Thus, mechanical properties of package substrates need to be further reinformed.

The above-described background art is technical information that had been possessed by the inventors before example embodiments were derived or were acquired by the inventors to derive example embodiments, and is not necessarily considered as a technology known to the public prior to the filing date of the present invention.

In this connection, Korean Patent No. 10-1799645 entitled "Lid for gas-tight sealing, method for manufacturing the same and electronic component receiving package using the same" and Korean Patent Registration No. 10-1242655 entitled "Heat spreader structure, semiconductor package using the same and method for manufacturing the same" are known in the art.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

One object of example embodiments is to reinforce the mechanical properties of a package substrate vulnerable to external stresses while improving the heat dissipation characteristics of the package substrate.

A further object of example embodiments is to protect a semiconductor device from damage such as fine cracks while minimizing the occurrence of factors causing electrical defects.

Another object of example embodiments is to improve the reliability of a package substrate and its associated system using a specially designed lid structure.

A substrate including a lid structure according to example embodiments includes a base substrate and a lid structure wherein the lid structure includes an accommodation space accommodating an element and a frame surrounding at least a portion of the accommodation space, is arranged on one surface of the base substrate, and is divided into an inner region and an outer region and wherein the inner region is located on one surface of the glass substrate and the outer region is a region excluding the inner region from the lid structure and is arranged in an area outside the edges of the base substrate.

According to one embodiment, the diagonal length of the lid structure may be greater than the diagonal length of the base substrate.

According to one embodiment, the length of the lid structure measured at one edge of the substrate including the lid structure may be 1% to 10% greater than the length of the base substrate measured at the same edge.

According to one embodiment, a redistribution layer may be arranged between the base substrate and the accommodation space and the sum of the weights of the base substrate and the redistribution layer may be greater than the weight of the frame.

According to one embodiment, the lid structure may further include a side closing portion surrounding the side surfaces of the base substrate.

According to one embodiment, when the coefficients of thermal expansion of the base substrate and the lid structure at 25° C. are defined as Cs and Cl, respectively, the ratio Cl/Cs may be 0.02 to 1.2.

According to one embodiment, the lid structure may have a thermal conductivity of 50 W/m K to 425 W/m K.

According to one embodiment, the lid structure may have a tensile strength of 12 MPa to 670 MPa.

According to one embodiment, an electric power transmission element may be embedded in the base substrate.

According to one embodiment, the lid structure may further include one or more holding holes arranged in the outer region of the lid structure.

A substrate including a lid structure according to other example embodiments includes a base substrate and a lid structure wherein the lid structure includes an accommodation space accommodating an element and a frame surrounding at least a portion of the accommodation space, and is arranged on one surface of the base substrate. The diagonal length of the lid structure may be greater than the diagonal length of the base substrate. The base substrate may be a glass substrate.

According to one embodiment, the length of the lid structure measured at one edge of the substrate including the lid structure may be 0% to 10% greater than the length of the base substrate measured at the same edge.

According to one embodiment, when the coefficients of thermal expansion of the base substrate and the lid structure at 25° C. are defined as Cs and Cl, respectively, the ratio Cl/Cs may be 0.02 to 1.2.

According to one embodiment, the lid structure may have a thermal conductivity of 50 W/m K to 425 W/m K.

According to one embodiment, the lid structure may have a tensile strength of 12 MPa to 670 MPa.

According to one embodiment, an electric power transmission element may be embedded in the base substrate.

According to one embodiment, the frame may further include one or more holding holes arranged in the lid structure.

According to one embodiment, the lid structure and the base substrate may further include one or more holding holes arranged through the lid structure and the base substrate.

A package substrate according to example embodiments includes the substrate including the lid structure and an element wherein the element is accommodated in the inner accommodation space.

According to one embodiment, the lid structure may further include a top surface closing portion closing the top surface of the element.

According to one embodiment, the height of the lid structure may be identical to or different by 10 μm or less from that of the top surface of the element.

According to one embodiment, the maximum width of a gap defined between the frame and the element may be 10 μm to 50,000 μm.

A semiconductor device according to example embodiments includes the substrate including the lid structure, at least one element arranged in the accommodation space, and a printed circuit board connected to the substrate including the lid structure.

DETAILED DESCRIPTION

Figure 1A:
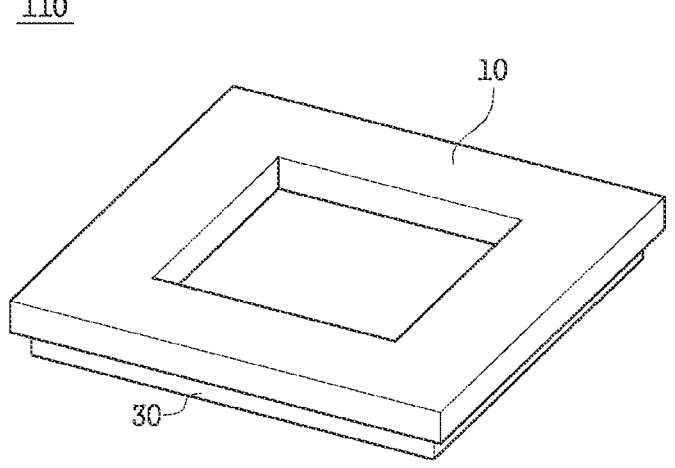
FIG. 1A and FIG. 1B are a perspective view illustrating an example of a substrate including a lid frame according to example embodiments, respectively.

Hereinafter, example embodiments of the present disclosure will be described in detail with reference to the accompanying drawings so that they can be easily practiced by those skilled in the art to which the present invention pertains. The example embodiments may, however, be embodied in many different forms and is not to be construed as being limited to the embodiments set forth herein. Like reference numerals designate like elements throughout the specification.

In the present specification, when an element is referred to as "comprising (or including)" another element, it indicates the presence or addition of one or more other elements and is not intended to preclude the possibility that one or more other elements may be present or added, unless otherwise stated.

In the present specification, it will be understood that when an element is referred to as being "connected" to another element, it can be directly connected to the other element or intervening elements may be present.

In the present specification, it will be understood that when "B" is referred to as being on "A", "B" can be directly on "A" or intervening layers may be present therebetween. That is, the location of "B" is not construed as being limited to direct contact of "B" with the surface of "A".

In the present specification, the term "combination of" included in Markush type description means mixture or combination of one or more elements described in Markush type and thereby means that the disclosure includes one or more elements selected from the Markush group.

In the present specification, the description "A and/or B" means "A or B, or A and B."

In the present specification, the terms "first" and "second" or "A" and "B" are used to distinguish one element from another, unless specifically stated otherwise.

In the present specification, a singular representation may include a plural representation as far as it represents a definitely different meaning from the context.

In the present specification, a substrate including a lid structure is interpreted as an assembly for a package substrate in which a lid structure is arranged on a substrate and a main element is not arranged.

In the present specification, a package substrate is interpreted as a structure in which an element, a lid structure, etc. are arranged on a substrate and to which other components such as a printed circuit board and a main board can be connected.

It should be noted that the drawings are not to precise scale and may be exaggerated for clarity and elements shown in the drawings are not interpreted as being limited to specific sizes and ratios.

Figure 1B:
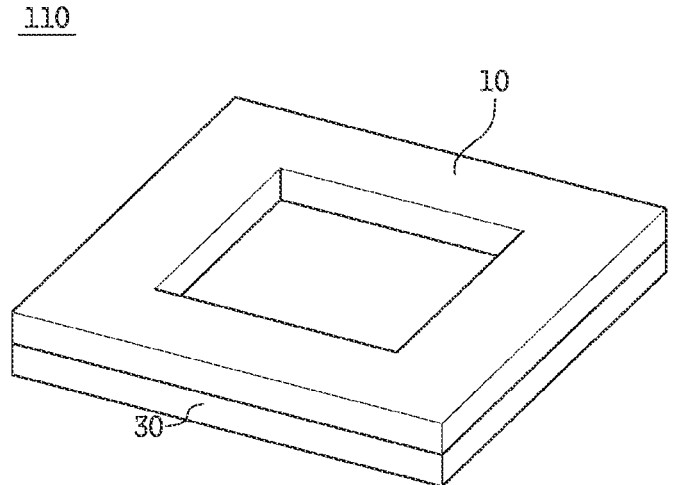
Figure 2A:
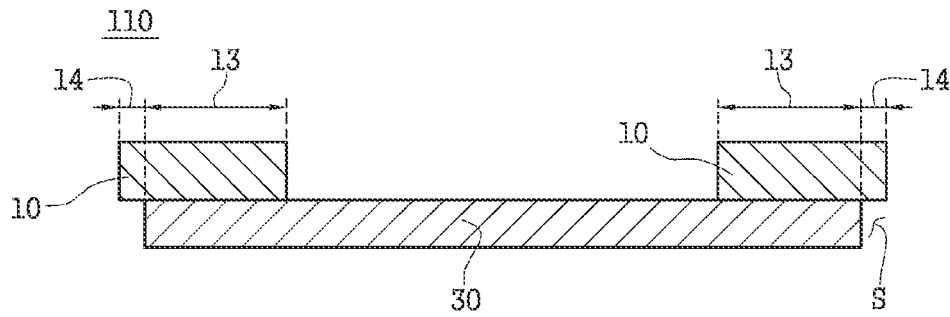
FIG. 2A and FIG. 2B are a conceptual cross-sectional view of a substrate including a lid frame according to example embodiments, respectively.
Figure 2B:
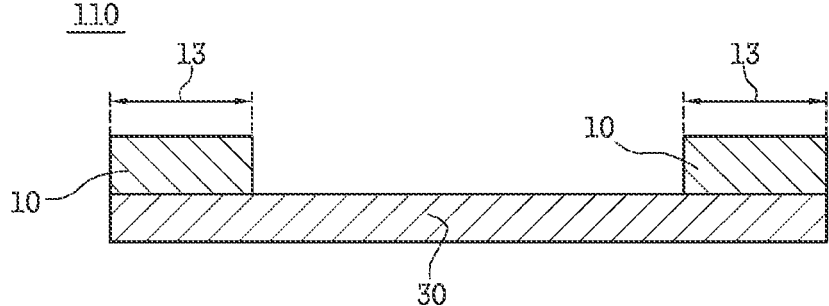
Figure 3A:
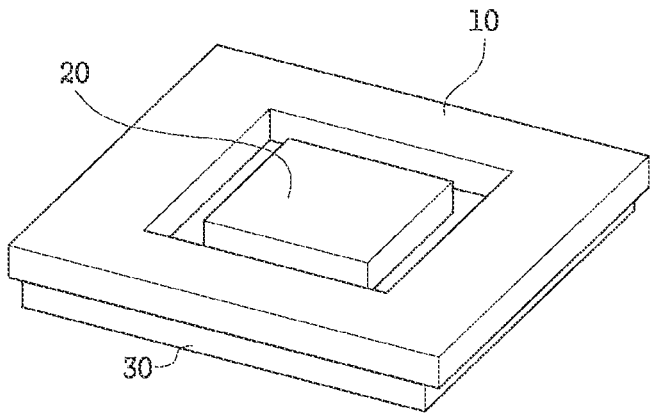
FIG. 3A and FIG. 3B are a perspective view illustrating an example of a package substrate according to other example embodiments, respectively.
Figure 3B:
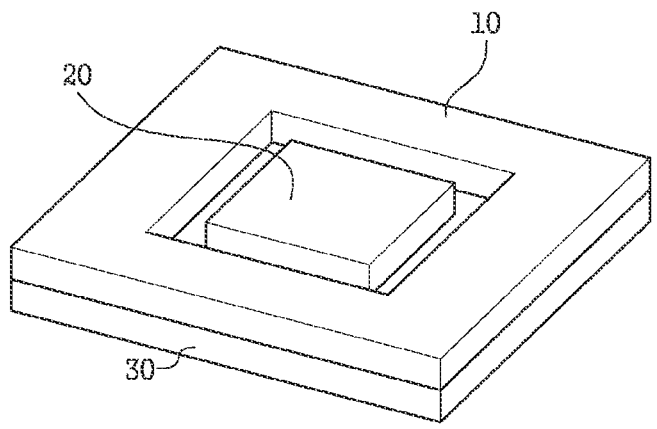
Figures 4A, 4B:
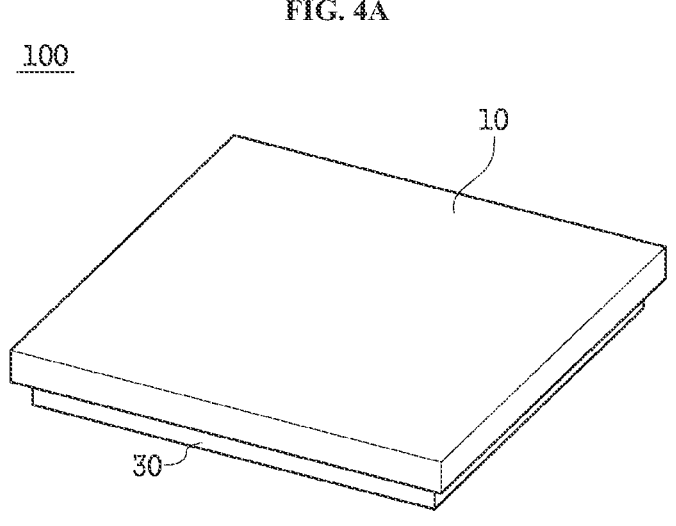
FIG. 4A and FIG. 4B are a perspective view illustrating an example of a package substrate according to other example embodiments, respectively.
Figure 5A:
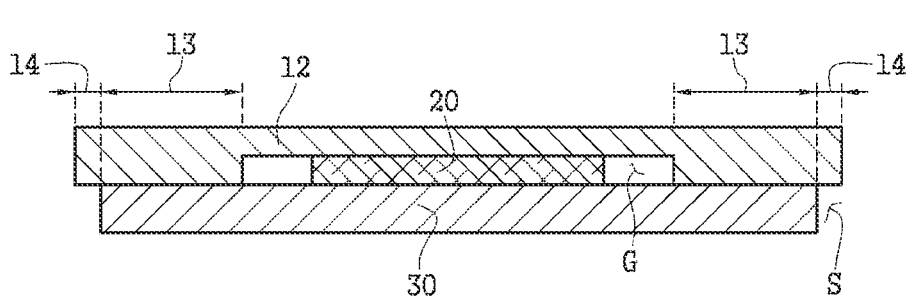
FIG. 5A and FIG. 5B are a conceptual cross-sectional view of a package substrate according to other example embodiments, respectively.
Figure 5B:
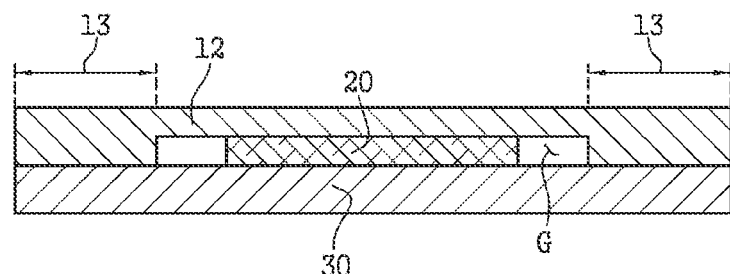
Figure 6:
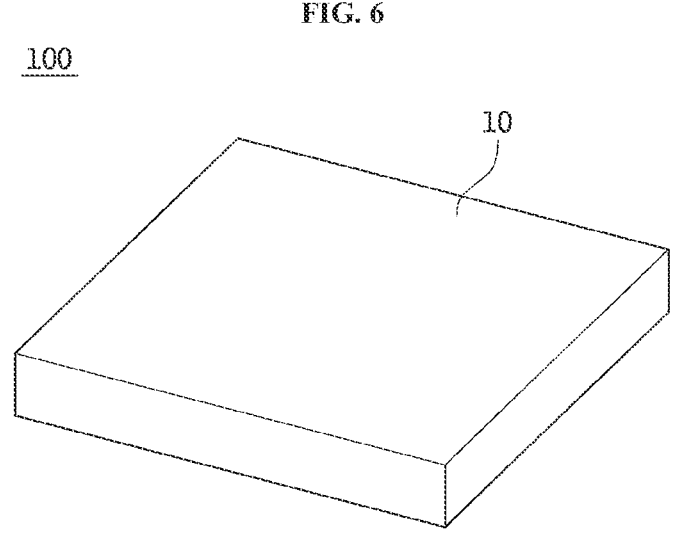
FIG. 6 is a cross-sectional perspective view of a package substrate according to other example embodiments.
Figure 7:
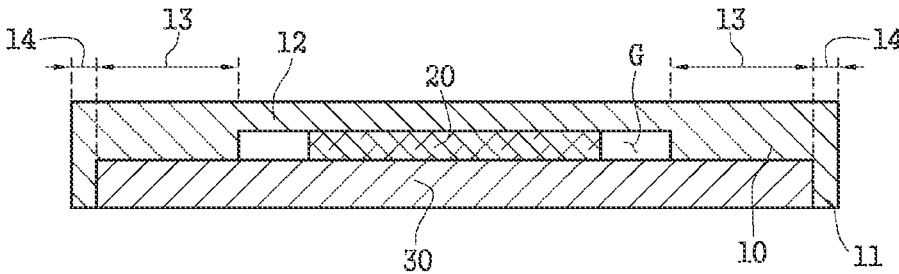
FIG. 7 is a conceptual cross-sectional view of a package substrate according to other example embodiments.
Figure 8:
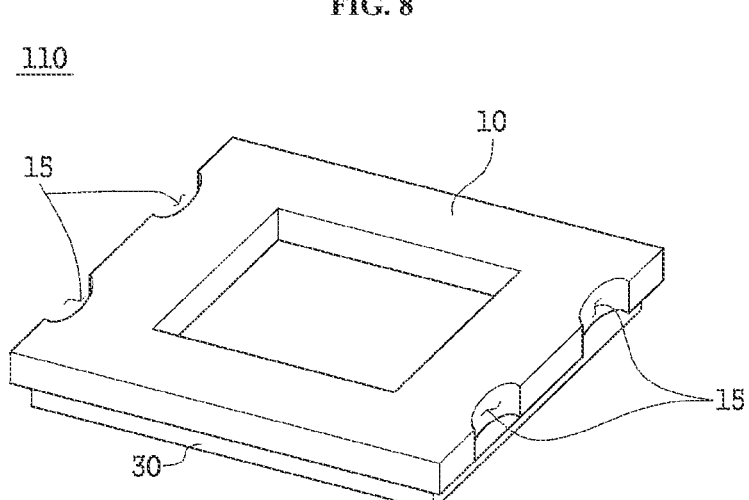
FIG. 8 is a cross-sectional perspective view of a package substrate according to other example embodiments.

FIG. 1A and FIG. 1B are a perspective view illustrating an example of a substrate including a lid frame according to example embodiments respectively, FIG. 2A and FIG. 2B are a conceptual cross-sectional view of a substrate including a lid frame according to example embodiments respectively, and FIG. 3A and FIG. 3B are a perspective view illustrating an example of a package substrate according to other example embodiments, respectively. FIG. 4A and FIG. 4B are a perspective view illustrating an example of a package substrate according to other example embodiments respectively, FIG. 5A and FIG. 5B are a conceptual cross-sectional view of a package substrate according to other example embodiments respectively, and FIG. 6 is a cross-sectional perspective view of a package substrate according to other example embodiments. FIG. 7 is a conceptual cross-sectional view of a package substrate according to other example embodiments; and FIG. 8 is a cross-sectional perspective view of a package substrate according to other example embodiments. Hereinafter, referring the above FIGS., a description will be given of a substrate including a lid structure, a packaging substrate, etc.

Substrate Comprising Lid Structure 110

A substrate comprising lid structure 110 according to example embodiments comprises a base substrate 30 and a lid structure 10 wherein the lid structure comprises an accommodation space accommodating an element 20 and a frame surrounding at least a portion of the accommodation space, is arranged on one surface of the base substrate (see FIG. 1A, FIG. 2A, FIG. 1B and FIG. 2B).

The lid structure is divided into an inner region 13 and an outer region 14 and wherein the inner region is located on one surface of the base substrate and the outer region is a region excluding the inner region from the lid structure and is arranged in an area outside the edges of the base substrate.

The outer region 14 has an outer periphery extending outwardly beyond the outer periphery of the base substrate 30. As illustrated in FIGS. 1A and 2A, the outwardly extending lid structure forms steps S relative to the glass substrate.

The outer periphery of the outer region 14 extends outwardly beyond all edges of the base substrate, as viewed from the top of the substrate 110. Alternatively, the outer periphery of the outer region 14 may extend outwardly beyond only some of the edges of the base substrate, as illustrated in FIG. 3A. The steps S formed between the lid structure and the base substrate 30 in the outer region may have substantially the same width in the outward direction. The width of each step may be 10 μm to 1000 μm or 100 μm to 500 μm.

The edges of the lid structure 10 may have a shape similar to the edges of the base substrate 30. The edges of the lid structure 10 may have substantially the same shape as the edges of the base substrate 30 and the outer perimeter of the lid structure 10 may be larger than that of the base substrate 30.

The lid structure 10 may have a rectangular shape in cross section, similarly to the base substrate 30. The accommodation space is empty and is formed so as to penetrate the lid structure 10. The accommodation space may also be, not limited to, rectangular in cross section and may correspond to a location where the element 20 is mounted, which will be described later.

The length of the lid structure 10 measured at one edge may be 1% to 10% or 2% to 9% greater than the length of the base substrate 30 measured at the same edge.

The lid structure 10 having a larger outer perimeter than the base substrate 30 covers the edges of the base substrate. The outer perimeter of the lid structure 10 may be 4% to 40% or 8% to 36% larger than that of the base substrate 30. These dimensions can improve the heat dissipation characteristics of the substrate comprising the lid structure without the need to enlarge the substrate and can stably protect the base substrate during subsequent processing. The outer circumference of each of the lid structure and the base substrate may be the outermost circumference thereof.

The diagonal length of the lid structure 10 may be greater than the diagonal length of the base substrate 30.

The base substrate 30 may be a prepreg. In detail, glass fibers in which polymer resin is incorporated may be applied.

The base substrate 30 may be a silicon substrate.

The base substrate 30 may be a glass substrate. In this case, fine electrically conductive line can be made relatively easily. Further, being different from a silicon substrate which has a semiconductive property, it may be beneficial with applying high frequency power.

When a glass substrate is applied as a base substrate, the lid structure 10 may have substantially the same size or greater.

According to other embodiments, a substrate including a lid structure 110 comprises a base substrate 30; and a lid structure 10. The lid structure 10 comprises an accommodation space accommodating an element and a frame surrounding at least a portion of the accommodation space, and is arranged on one surface of the base substrate. The diagonal length of the lid structure may be greater than the diagonal length of the base substrate. The base substrate may be a glass substrate.

The length of the lid structure measured at one edge of the substrate including the lid structure may be 0% to 10% greater than the length of the base substrate measured at the same edge.

The lid structure 10 may comprise a through-hole in the thickness direction (See FIG. 1A, FIG. 1B, FIG. 2A, FIG. 2B, FIG. 3A, and FIG. 3B.) The through-hole may be provided in one or in plurality. The through-hole may have a sufficient space in which another element is mounted on the base substrate 30 and is surrounded by the lid structure. The element mounted in the through-hole may be, for example, a memory element or a capacitor. The capacitor may be an aluminum capacitor or a multilayer ceramic capacitor (MLCC).

Each of the outer side surfaces of the lid structure 10, the inner side surfaces of the inner space, and the side closing portion 11 may further comprise a radiation coating layer formed thereon. The radiation coating layer may comprise a metal oxide such as iron oxide, alumina or copper oxide and a carbonaceous material such as graphite.

As illustrated in FIGS. 4A to 5B, the lid structure 10 may cover a top surface of a base substrate 30. A closing portion 12 is a part closing top surface of a base substrate 30 and/or an element and is distinguishable from a frame. The top surface closing portion may close the space in which the element is placed and may be in contact with the element to facilitate the transfer and dissipation of heat from the element.

The top surface closing portion 12 may be prepared with a different material as the lid structure 10.

The top surface closing portion 12 may be prepared with the same material as the lid structure 10.

The top surface closing portion 12 may have a thickness of 10 μm to 1000 μm or 100 μm to 500 μm.

When the top surface closing portion 12 is formed in the lid structure 10, a thermally conductive filler may be filled in a gap between the element 20 and the lid structure 10 or the interface between the element and the lid may be subjected to soldering.

The lid structure 10 may form a predetermined gap G with the element 20. The gap may have a maximum width of 10 μm to 50,000 μm or 10 μm to 10,000 μm. The gap may also be filled with a thermally conductive filler.

When the lid structure 10 is open without the top surface closing portion 12, its height may be identical to or different by 10 μm or less from the height of the element 20. These dimensions can minimize the formation of a gap or a step when an additional member is placed on the element.

When applying a lid structure with a top surface closing portion, an element will be disposed in the lid structure. Therefore, in the progress of assembling a base substrate and a lid structure, an element may be disposed at a predetermined location. Or a lid structure and a base substrate may be removably assembled to dispose an element at a later day. An accommodation space in which dispose an element may be encapsuled with an encapsulant.

A lid structure, a top surface closing portion, or a base substrate may comprise at least one breath hole. The breath hole may help discharge heat that may be generated when a device is driven to the outside of a package substrate.

As illustrated in FIGS. 6 and 7, the lid structure 10 may further comprise a side closing portion 11 surrounding the side surfaces of the base substrate 30. The side closing portion serves to protect the substrate from external impacts when the substate is made of a material vulnerable to impacts. In addition, the side closing portion facilitates heat transfer and dissipation.

The side closing portion 11 may be connected to a lid structure 10 to be integrally formed. When a side closing portion and a lid structure are integrally formed, a part positioned to face the side surface of the basic substrate is treated as a side closing portion.

The side closing portion 11 may be formed separately from a lid structure 10 and then coupled thereto. An adhesion or fastening structure may be applied to the assembly comprising the side closing portion and the lid structure without limitation.

The side closing portion 11 may be prepared with a different material as the lid structure 10.

The side closing portion 11 may be prepared with the same material as the lid structure 10.

The side closing portion 11 may have a thickness (or width) of 10 μm to 1000 μm or 100 μm to 500 μm in an outward direction from the center of the base substrate 30.

The one surface of a side closing portion 11 may not be stepped relative to the base substrate because there is no substantial difference in height between the side closing portion.

The other surface of the side closing portion 11 may be disposed next to the surface of the base substrate 30 on which the element 20 is disposed. In case of having a cavity structure, the height of a base substrate could not be even. One upper side of a side closing portion 11 and one upper side of a base substrate neighboring the side closing portion 11 may be in a line and may not have a step substantially.

The lid structure 10 may further comprise a heat sink and a cooler on the heat sink that help dissipation of heat generated from the element 20. In this case, the heat sink may be in contact with the element through a thermally conductive medium such as a thermal grease.

The lid structure 10 may have a thickness of 50 μm to 3000 μm or 100 μm to 1500 μm in a direction from the surface in contact with the base substrate 30 to the opposite surface. The lid structure may have a width of 2 mm to 10 mm or 3 mm to 9 mm. These dimensions ensure sufficient heat transfer characteristics of the lid structure and effectively protect the base substrate from external impacts. Specially, a glass substrate is applied as a base substrate, the lid structure can bear impacts from external, and it can bring a preventing effect to break the glass substrate.

The lid structure 10 may have a thermal conductivity of 50 W/mK to 425 W/mK or 80 W/mK to 425 W/mK.

The lid structure 10 may have a tensile strength of 12 MPa to 670 MPa or 50 MPa to 500 MPa.

The frame of the lid structure 10 may further comprise one or more holding holes 15 at both opposite edges, as illustrated in FIG. 8. The holding holes 15 may be arranged in the outer region of the lid structure. The holding holes 15 may be recessed inwardly from the outermost periphery of the lid structure. The holding holes 15 serve to minimize damage to the base substrate 30 when impacted during transport and processing of the substrate comprising the lid structure 110. Specially, when a glass substrate is applied as the base substrate, the frame can help to bear impacts from external. And a degree on breaking a glass substrate which can occur unintendedly may be reduced, and workability at a manufacturing can enhance.

The use of the base substrate 30 for a high-end package substrate is advantageous in that interconnection wires between the element 20 and a printed circuit board (not illustrated) are shortened, and excellent electrical properties can be achieved.

Examples of materials for the base substrate 30 comprise tempered glass, borosilicate glass, and alkali-free glass. Any organic compound may not be substantially present in the base substrate.

The base substrate 30 and the lid structure 10 may be bonded to each other with a silicone-based material and/or an epoxy-based material.

When the coefficients of thermal expansion of the base substrate 30 and the lid structure 10 are defined as Cs and Cl, respectively, the ratio Cl/Cs may be in the range of 0.02 to 1.2 or 0.1 to 1. Within this range, the reliability of the element 20 can be enhanced and the base substrate has good mechanical properties.

The base substrate 30 may have a thickness of 2000 μm or less, 100 μm to 1500 μm or 100 μm to 1000 μm. With these dimensions, the base substrate allows for more efficient transmission of electrical signals while maintaining its proper mechanical properties in a state in which the lid structure 10 is arranged.

The base substrate 30 may comprise a plurality of core vias passing through it in the thickness direction.

The base substrate 30 may further comprise a plurality of vias, some of which form paths in the thickness direction thereof, and other vias forming paths in a direction substantially perpendicular to the thickness direction.

The base substrate 30 may comprise electrically conductive layers formed in at least portions thereof to electrically connect one surface and the other surface thereof through the core vias and the vias.

The base substrate 30 may comprise a circuit pattern formed on one surface and/or the other surface thereof. The opposite surface to the surface of the base substrate 30 where the element 20 is disposed may be electrically connected to a printed circuit board via electrical connection means such as a lead frame or solder balls.

Optionally, a redistribution layer may be arranged between the base substrate 30 and the accommodation space of the lid structure 10. The sum of the weights of the base substrate and the redistribution layer may be greater than the weight of the frame of the lid structure. A conventional interposer using a prepreg may cause distortion of a substrate during formation of a redistribution layer and mounting of an element. This distortion can be avoided by using a lid arranged on one surface of the interposer. At this time, the lid uses a heavy material to suppress distortion of the substrate. The glass substrate used as a base substrate in example embodiments undergoes minimal distortion, unlike a prepreg in which a glass fiber is impregnated with a polymer. Therefore, there is no need to use a heavy material for the purpose of suppressing distortion, unlike when the conventional lid is used. Rather, the use of a heavy material is contrary to the weight reduction of a package, which is another purpose of example embodiments. It is thus preferable that the lid structure is lighter than the sum of the weights a package substrate comprising the glass substrate and the redistribution layer, as described above.

An electric power transmission element may be disposed inside the base substrate 30 or arranged in a cavity formed in the base substrate.

The substrate comprising the lid structure 110 may not include a separate member to protect the exterior of the base substrate 30, such as a housing, a case or a socket body.

The element 20 may be, for example, a computing element of a central processing unit (CPU) or a graphic processing unit (GPU). Alternatively, the element 20 may be a memory element of a memory chip. However, the element 20 is not particularly limited and may be any element that can be usually mounted on the base substrate.

The presence of the specially designed lid structure on the base substrate 30 mounted with the element 20 in the substrate 110 of example embodiments leads to improvements in heat dissipation characteristics such as heat conduction and heat radiation and ensures satisfactorily good mechanical properties to minimize the occurrence of a situation that may deteriorate the reliability of the element.

Package Substrate 100

A package substrate 100 according to example embodiments comprises a substrate 100 comprising a lid structure and an element 20 wherein the element is accommodated in an inner accommodation space.

The substrate 100 comprising a lid structure is the same as that described above and a description thereof will be omitted to avoid duplication.

As illustrated in FIGS. 4A to 7, the package substrate 100 may further comprise a top surface closing portion 12 closing the top surface of an element 20. The top surface closing portion may close the space in which the element is placed and may be in contact with the element to facilitate the transfer and dissipation of heat from the element.

The top surface closing portion 12 may be prepared with the same material as the lid structure 10.

The top surface closing portion 12 may be prepared with a different material as the lid structure 10.

The top surface closing portion 12 may have a thickness of 10 μm to 1000 μm or 100 μm to 500 μm.

When the top surface closing portion 12 is formed in the lid structure 10, a thermally conductive filler may be filled in a gap between the element 20 and the lid structure 10 or the interface between the element and the lid may be subjected to soldering.

The lid structure 10 may form a predetermined gap G with the element 20. The gap may have a maximum width of 10 μm to 50,000 μm or 10 μm to 10,000 μm. The gap may also be filled with a thermally conductive filler.

When the lid structure 10 is open without the top surface closing portion 12, its height may be identical to or different by 10 μm or less from the height of the element 20. These dimensions can minimize the formation of a gap or a step when an additional member is placed on the element.

Semiconductor Device

A semiconductor device according to example embodiments comprises a substrate 100 comprising a lid structure, at least one element 20 arranged in an accommodation space, and a printed circuit board connected to the substrate comprising the lid structure.

The printed circuit board may be electrically connected to the substrate 100 comprising the lid structure and the element 20. The printed circuit board may be a main board.

The substrate 100 comprising the lid structure and the element 20 are the same as those described above and a description thereof will be omitted to avoid duplication.

Method for Manufacturing Substrate Comprising Lid Structure and Package Substrate A method for manufacturing a substrate comprising a lid structure and a package substrate according to example embodiments comprises an operation of mounting an element 20 on a base substrate 30; and an operation of forming a lid structure 10 on the base substrate, either before or after the operation of mounting.

When the lid structure is integrally formed with a top surface closing portion 12, the lid structure may be formed after mounting of the element.

The operation of mounting may comprise bonding the element 20 to one surface of the base substrate 30 with an incapsulating compound. The incapsulating compound may comprise an epoxy-based material.

The operation for forming a lid structure 10 may comprise preparing a lid structure having a preset shape and bonding the lid structure to the base substrate 30. The lid structure may be bonded to the substrate through an epoxy-based and/or silicone-based material. The lid structure may be formed by different processes, for example, die casting, sintering or mechanical processing, depending on its material.

The method for manufacturing a package substrate comprising a lid structure may further comprise an operation of forming core vias connecting one surface and the other surface of the base substrate 30 and vias forming paths inside the base substrate. The operation of forming core vias and vias may be carried out by removing preset portions of the base substrate or physically or chemically etching the planer substrate. As another example, the core vias and the vias may be prepared by forming defects and recesses on the surface of the glass substrate as a base substrate with a laser, followed by chemical etching or laser etching. Alternatively, the core vias and the vias may be formed by laminating a plurality of substrates.

Since the substrate comprising the lid structure and the package substrate manufactured by the method are the same as those described above and a description thereof will be omitted to avoid duplication.

The substrate including the lid structure and the package substrate according to example embodiments may have improved heat dissipation characteristics and satisfactorily good mechanical properties sufficient to minimize the occurrence of factors causing defects.

The foregoing preferred embodiments of example embodiments have been explained in detail, but the scope of the present invention should not be limited thereto, and various modifications and improvements made by a person of ordinary skill in the art with using a basic concept defined by the following claims should also be construed to belong to the scope of the present invention.

What is claimed is:

1. A substrate comprising:

a base substrate that is glass; and a lid structure, wherein the lid structure comprises an accommodation space accommodating an element and a frame surrounding at least a portion of the accommodation space, wherein the lid structure is arranged on a surface of the base substrate, and is divided into an inner region and an outer region, wherein the inner region is disposed on the surface of the base substrate and the outer region is a region exclusive of the inner region, wherein the outer region is a portion of the lid structure that, in a plan view, extends beyond the surface of the base substrate, wherein the outer region, in the plan view, has an outer vertical edge and an inner vertical edge opposite the outer vertical edge, and wherein the frame comprises a plurality of holding holes, each recessed inwardly from the outer vertical edge to the inner vertical edge, the plurality of holding holes including at least one holding hole at each of two opposite edges of the lid structure.

2. The substrate according to claim 1, wherein a diagonal length of the lid structure is greater than a diagonal length of the base substrate.

3. The substrate according to claim 1, wherein a length of the lid structure measured at one edge of the substrate comprising the lid structure is 1% to 10% greater than a length of the base substrate measured at the same edge.

4. The substrate according to claim 1, wherein a redistribution layer is arranged between the base substrate and the accommodation space and a sum of weights of the base substrate and the redistribution layer is greater than a weight of the frame.

5. The substrate according to claim 1, wherein the base substrate comprises a plurality of side surfaces, and wherein the lid structure further comprises a side closing portion surrounding all the plurality of side surfaces of the base substrate.

6. The substrate according to claim 1, wherein when the coefficients of thermal expansion of the base substrate and the lid structure at 25° C. are defined as Cs and Cl, respectively, a ratio Cl/Cs is 0.02 to 1.2.

7. The substrate according to claim 1, wherein the lid structure has a thermal conductivity of 50 W/mK to 425 W/mK.

8. The substrate according to claim 1, wherein the lid structure has a tensile strength of 12 MPa to 670 MPa.

9. A substrate comprising:

a base substrate that is glass; and a lid structure, wherein the lid structure comprises an accommodation space accommodating an element and a frame surrounding at least a portion of the accommodation space, wherein the lid structure is arranged on a surface of the base substrate, and is divided into an inner region and an outer region, wherein the inner region is disposed on the surface of the base substrate and the outer region is a region exclusive of the inner region, wherein the outer region is a portion of the lid structure that, in a plan view, extends beyond the surface of the base substrate, wherein the outer region, in the plan view, has an outer vertical edge and an inner vertical edge opposite the outer vertical edge, wherein a length of the lid structure measured at one edge of the substrate comprising the lid structure is 0% to 10% greater than a length of the base substrate measured at the same edge, and wherein the frame comprises a plurality of holding holes, each recessed inwardly from the outer vertical edge to the inner vertical edge, the plurality of holding holes including at least one holding hole at each of two opposite edges of the lid structure.

10. A package substrate according to claim 1, comprising:

the substrate of claim 1; and the element, wherein the element is accommodated in the accommodation space.

11. The package substrate according to claim 10, further comprising a top surface closing portion closing a top surface of the element.

12. The package substrate according to claim 10, wherein the height of a top surface of the lid structure is identical to or different by 10 μm or less from that of a top surface of the element.

13. A package substrate comprising: the substrate of claim 9; and the element, wherein the element is accommodated in the accommodation space.

14. The package substrate according to claim 13, further comprising a top surface closing portion closing a top surface of the element.

15. A semiconductor device comprising: the substrate of claim 1;

the element arranged in the accommodation space; and a printed circuit board connected to the substrate.

16. A semiconductor device comprising:

the substrate of claim 9;

at least one element arranged in the accommodation space; and a printed circuit board connected to the substrate.

17. The package substrate according to claim 11, wherein the top surface closing portion has a thickness of 10 μm to 1000 μm from its top surface to its bottom surface.

18. The substrate according to claim 1, wherein the lid structure has a thickness of 50 μm to 3000 μm from a bottom surface of the lid structure disposed on the base substrate to a top surface of the lid structure.

* * * * *